US009199497B2

(12) United States Patent
Kohri

(10) Patent No.: US 9,199,497 B2
(45) Date of Patent: Dec. 1, 2015

(54) IMAGE FORMING SYSTEM, POWER CALCULATION METHOD, AND POWER CALCULATING APPARATUS

(75) Inventor: Yuusuke Kohri, Kanagawa (JP)

(73) Assignee: RICOH COMPANY, LIMITED, Tokyo (JP)

( * ) Notice: Subject to any disclaimer, the term of this patent is extended or adjusted under 35 U.S.C. 154(b) by 442 days.

(21) Appl. No.: 13/611,473

(22) Filed: Sep. 12, 2012

(65) Prior Publication Data

US 2013/0063130 A1 Mar. 14, 2013

(30) Foreign Application Priority Data

Sep. 14, 2011 (JP) ................................ 2011-201158

(51) Int. Cl.
*G01R 21/06* (2006.01)
*G03G 15/00* (2006.01)
*B41J 29/393* (2006.01)
*B41J 29/38* (2006.01)

(52) U.S. Cl.
CPC ............... *B41J 29/393* (2013.01); *B41J 29/38* (2013.01); *G03G 15/5004* (2013.01); *G03G 15/80* (2013.01)

(58) Field of Classification Search
CPC ... G01R 21/06; G03G 15/80; G03G 15/5004; G03G 15/00; G06F 1/3284; G06F 1/3287
USPC .......... 324/140 R, 123 R, 127, 128, 140, 500, 324/512, 519, 713; 399/67, 88, 37, 33, 69, 399/70
See application file for complete search history.

(56) References Cited

U.S. PATENT DOCUMENTS

| | | | | |
|---|---|---|---|---|
| 6,393,233 | B1 * | 5/2002 | Soulier | 399/88 |
| 2004/0096236 | A1 * | 5/2004 | Shin | 399/88 |
| 2009/0324265 | A1 * | 12/2009 | Ito | 399/43 |
| 2012/0002233 | A1 * | 1/2012 | Hasegawa | 358/1.14 |
| 2012/0243057 | A1 * | 9/2012 | Sano | 358/471 |
| 2013/0094876 | A1 * | 4/2013 | Okunishi et al. | 399/88 |

FOREIGN PATENT DOCUMENTS

| | | |
|---|---|---|
| JP | 2003-80804 | 3/2003 |
| JP | 2006-322761 | 11/2006 |

(Continued)

OTHER PUBLICATIONS

Office Action issued Apr. 28, 2015, in Japanese Patent Application No. 2011-201158.

*Primary Examiner* — Tung X Nguyen
*Assistant Examiner* — Neel Shah
(74) *Attorney, Agent, or Firm* — Oblon, McClelland, Maier & Neustadt, L.L.P.

(57) ABSTRACT

According to an embodiment, an image forming system includes: an image forming apparatus; a peripheral device; and a first control unit. The image forming apparatus includes a first voltage detecting unit that detects voltage of a first power source supplied by an external power source, and outputs as first voltage value; and a first current detecting unit that detects current of the first power source, and outputs as first current value. The peripheral device includes a second voltage detecting unit that detects voltage of a second power source supplied by an external power source, and outputs as second voltage value; and a second current detecting unit that detects current of the second power source and outputs as second current value. The first control unit calculates total power value of the image forming system based on: the first voltage value; first current value; second voltage value; and second current value.

7 Claims, 11 Drawing Sheets

(56) References Cited

FOREIGN PATENT DOCUMENTS

| | | |
|---|---|---|
| JP | 2007-280003 | 10/2007 |
| JP | 2007-295433 | 11/2007 |
| JP | 2008-23951 | 2/2008 |
| JP | 2010-104110 | 5/2010 |
| JP | 2010-166690 | 7/2010 |

* cited by examiner

IMAGE FORMING SYSTEM, POWER CALCULATION METHOD, AND POWER CALCULATING APPARATUS

CROSS-REFERENCE TO RELATED APPLICATIONS

The present application claims priority to and incorporates by reference the entire contents of Japanese Patent Application No. 2011-201158 filed in Japan on Sep. 14, 2011.

BACKGROUND OF THE INVENTION

1. Field of the Invention

The present embodiments relate to an image forming system, a power calculation method, and power calculating apparatus.

2. Description of the Related Art

Conventionally, in an image forming system including an image forming apparatus and a peripheral device, there is a known technology for calculating total power of the image forming apparatus and the peripheral device. For example, Japanese Patent Application Laid-open No. 2003-80804 discloses a technology, in which an option unit added to an image forming apparatus is provided with status information indicating the degree of power consumption in each operation mode, and the image forming apparatus receives the status information from the option unit to calculate the total power consumption of the image forming apparatus and the option unit.

However, in the conventional technology described above, power of the peripheral device is not actually measured. Therefore, in some cases, the accuracy of the calculated total power is low.

Therefore, there is a need to provide an image forming system, a power calculation method, and a power calculating apparatus capable of accurately calculating the total power of the image forming system.

SUMMARY OF THE INVENTION

It is an object of the present invention to at least partially solve the problems in the conventional technology.

According to an embodiment, an image forming system includes: an image forming apparatus; a peripheral device; and a first control unit. The image forming apparatus includes a first voltage detecting unit that detects one of a primary voltage and a secondary voltage of a first power source that converts at least a voltage of power supplied by an external power source, and outputs a value of the detected voltage as a first voltage value; and a first current detecting unit that detects one of a primary current and a secondary current of the first power source, and outputs a value of the detected current as a first current value. The peripheral device that includes a second voltage detecting unit that detects one of a primary voltage and a secondary voltage of a second power source that converts at least a voltage of power supplied by an external power source, and outputs a value of the detected voltage as a second voltage value; and a second current detecting unit that detects one of a primary current and a secondary current of the second power source and outputs a value of the detected current as a second current value. The first control unit that calculates a total power value of the image forming system based on the first voltage value, the first current value, the second voltage value, and the second current value.

According to another embodiment, there is provided a power calculation method for an image forming system that includes an image forming apparatus and a peripheral device. The power calculation method includes: first detecting that includes detecting, by a first voltage detecting unit of the image forming apparatus, one of a primary voltage and a secondary voltage of a first power source that converts at least a voltage of power supplied by an external power source and so as to output a value of the detected voltage as a first voltage value; second detecting that includes detecting, by a first current detecting unit of the image forming apparatus, one of a primary current and a secondary current of the first power source so as to output a value of the detected current as a first current value; third detecting that includes detecting, by a second voltage detecting unit of the peripheral device, one of a primary voltage and a secondary voltage of a second power source that converts at least a voltage of power supplied by an external power source so as to output a value of the detected voltage as a second voltage value; fourth detecting that includes detecting, by a second current detecting unit of the peripheral device, one of a primary current and a secondary current of the second power source so as to output a value of the detected current as a second current value; and calculating, by a first control unit of the image forming system, a total power value of the image forming system based on the first voltage value, the first current value, the second voltage value, and the second current value.

According to still another embodiment, the power calculating apparatus calculates total power of an image forming system including at least an image forming apparatus and a peripheral device. The power calculating apparatus calculates the total power of the image forming system based on: a first voltage value that is a value of one of a primary voltage and a secondary voltage of a first power source that converts at least a voltage of power supplied from an external power source to the image forming apparatus; a first current value that is a value of one of a primary current and a secondary current of the first power source; a second voltage value that is a value of one of a primary voltage and a secondary voltage of a second power source that converts at least a voltage of power supplied from an external power source to the peripheral device; and a second current value that is a value of one of a primary current and a secondary current of the second power source.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments will be explained in detail below with reference to the accompanying drawings.

First Embodiment

A configuration of an image forming system 100 according to a first embodiment will be explained below.

Figure 1:
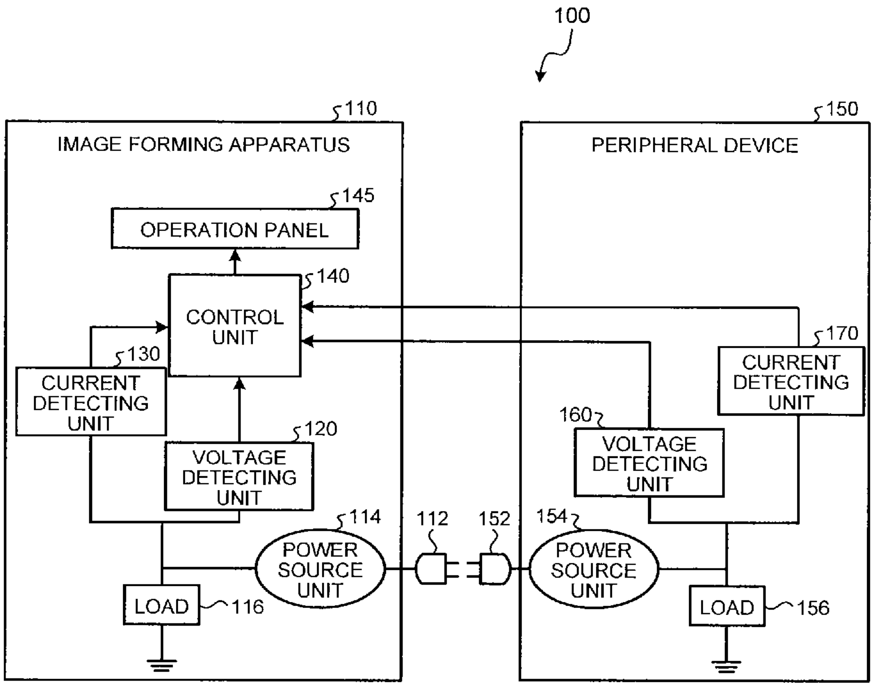
FIG. 1 is a block diagram of an example configuration of an image forming system according to a first embodiment.

FIG. 1 is a block diagram of an example configuration of the image forming system 100 according to the first embodiment. As illustrated in FIG. 1, the image forming system 100 includes an image forming apparatus 110 and a peripheral device 150. The image forming apparatus 110 and the peripheral device 150 are connected online.

The image forming apparatus 110 forms an image to generate a printed matter. Examples of the image forming apparatus 110 include a multifunction peripheral, a copier, and a printer. The multifunction peripheral is a device having at least two of a copying function, a printing function, a scanner function, and a facsimile function. The image forming apparatus 110 includes, as illustrated in FIG. 1, an alternating current (AC) power code 112, a power source unit 114, a load 116, a voltage detecting unit 120, a current detecting unit 130, a control unit 140, and an operation panel 145.

The AC power code 112 supplies power (AC power) from an external power source, such as a commercial (AC) power source, to the image forming apparatus 110 (the power source unit 114).

The power source unit 114 converts the voltage or the frequency of the power supplied via the AC power code 112, to thereby convert the power into power (DC power) in a form suitable for the image forming apparatus 110.

The load 116 is a load related to image formation performed by, for example, an image forming mechanism, a transfer mechanism, or a conveying mechanism. The load 116 consumes the power converted by the power source unit 114.

The voltage detecting unit 120 detects a secondary voltage (on the DC side) of the power source unit 114 and outputs a detected voltage value (analog value). The voltage detecting unit 120 detects a voltage by, for example, a system using a transformer or a voltage divider resistance. The voltage detecting unit 120 continues to detect the secondary voltage of the power source unit 114 and continues to output the detected voltage value to the control unit 140.

Figure 2:
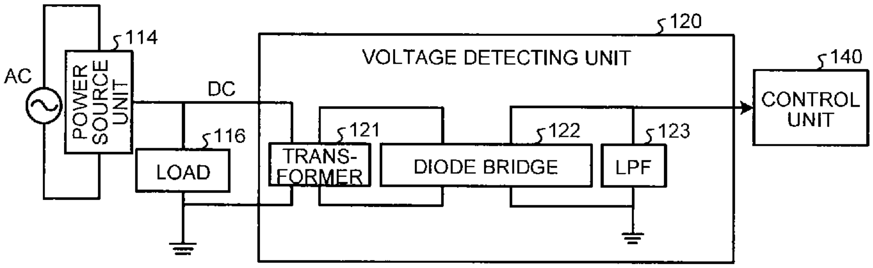
FIG. 2 is a circuit diagram of an example configuration of a voltage detecting unit when a voltage is detected by a system using a transformer.

FIG. 2 is a circuit diagram of an example configuration of the voltage detecting unit 120 when a voltage is detected by a system using a transformer. As illustrated in FIG. 2, in a case where a voltage is detected by the system using a transformer, the voltage detecting unit 120 includes a transformer 121, a diode bridge 122, and a low pass filter (LPF) 123. The voltage detecting unit 120 reduces the voltage of the power converted by the power source unit 114 by the transformer 121; performs full-wave rectification by the diode bridge 122; and provides a smoothed output by the LPF 123. Consequently, the voltage detecting unit 120 outputs the secondary voltage value of the power source unit 114.

Figure 3:
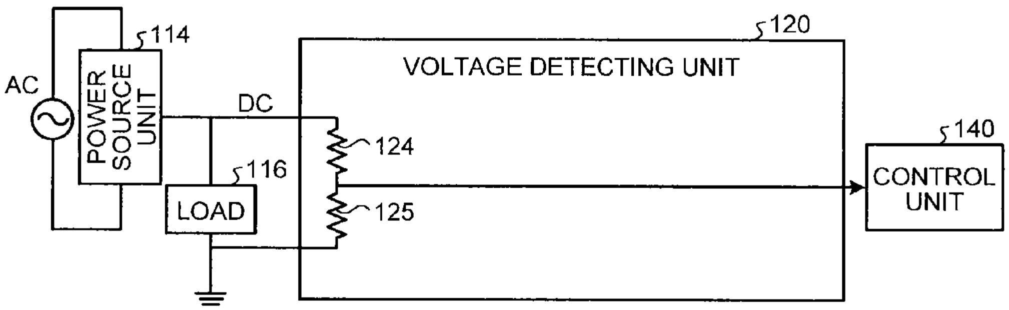
FIG. 3 is a circuit diagram of an example configuration of a voltage detecting unit when a voltage is detected by a system using a voltage divider resistance.

FIG. 3 is a circuit diagram of an example configuration of the voltage detecting unit 120 in a case where a voltage is detected by the system using a voltage divider resistance. As illustrated in FIG. 3, in a case where a voltage is detected by the system using a voltage divider resistance, the voltage detecting unit 120 includes voltage divider resistances 124 and 125. The voltage detecting unit 120 reduces the voltage of the power converted by the power source unit 114 to within the rated input voltage of the control unit 140 by the voltage divider resistances 124 and 125. Consequently, the voltage detecting unit 120 outputs a secondary voltage value of the power source unit 114.

The current detecting unit 130 detects a secondary current (on the DC side) of the power source unit 114 and outputs a detected current value (analog value). The current detecting unit 130 detects an electric current by, for example, a system using a current sensing integrated circuit (IC). The current detecting unit 130 continues to detect the secondary current of the power source unit 114 and continues to output the detected current value to the control unit 140.

Figure 4:
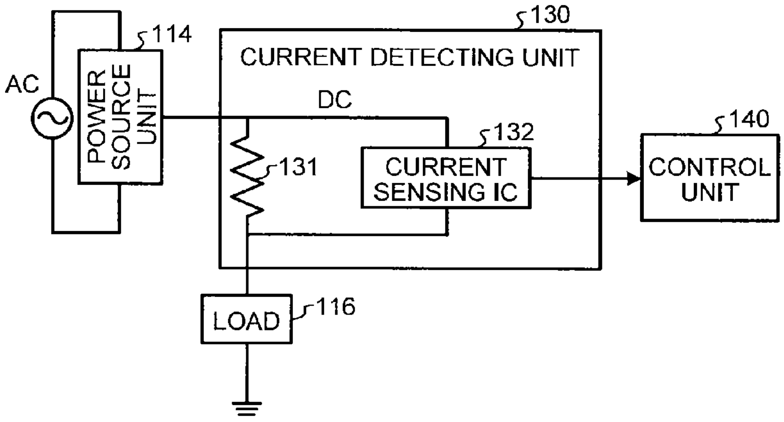
FIG. 4 is a circuit diagram of an example configuration of a current detecting unit when an electric current is detected by a system using a current sensing integrated circuit (IC)

FIG. 4 is a circuit diagram of an example configuration of the current detecting unit 130 in a case where an electric current is detected by the system using a current sensing IC. As illustrated in FIG. 4, in a case where an electric current is detected by the system using a current sensing IC, the current detecting unit 130 includes a micro resistance 131 inserted between the power source unit 114 and the load 116 and a current sensing IC 132. The current detecting unit 130 reduces the voltage of the power converted by the power source unit 114 by the micro resistance 131 and detects a current value by the current sensing IC 132. Consequently, the current detecting unit 130 outputs the secondary current value of the power source unit 114.

The peripheral device 150 will be explained below. The peripheral device 150 is, for example, a post processing device, and performs post processing such as stapling, punching, or folding on a printed matter generated by the image forming apparatus 110. However, the peripheral device 150 is not limited to the post processing device. Any device that can cooperate with the image forming apparatus 110 can be applied as the peripheral device. The peripheral device 150 includes as illustrated in FIG. 1 an AC power code 152, a power source unit 154, a load 156, a voltage detecting unit 160, and a current detecting unit 170.

The AC power code 152 supplies power (AC power) from an external power source such as a commercial power source, to the peripheral device 150 (the power source unit 154).

The power source unit 154 converts the voltage or the frequency of the power supplied via the AC power code 152, to thereby convert the power into power (DC power) in a form suitable for the peripheral device 150.

The load 156 is a load related to post processing performed by for example a stapling mechanism, a punching mechanism, a folding mechanism, or a conveying mechanism. The load 156 consumes the power converted by the power source unit 154.

The voltage detecting unit 160 detects a secondary voltage (on the DC side) of the power source unit 154 and outputs a detected voltage value (analog value). The voltage detecting unit 160 detects a voltage by a system using a transformer or a voltage divider resistance, similarly to the voltage detecting unit 120. The voltage detecting unit 160 continues to detect the secondary voltage of the power source unit 154 and continues to output the detected voltage value to the image forming apparatus 110 (the control unit 140).

The current detecting unit 170 detects a secondary current (on the DC side) of the power source unit 154 and outputs a detected current value (analog value). The current detecting unit 170 detects an electric current by a system using a current sensing IC, similarly to the current detecting unit 130. The current detecting unit 170 continues to detect the secondary current of the power source unit 154 and continues to output the detected current value to the image forming apparatus 110 (the control unit 140).

Explanation of the image forming apparatus 110 is continued below.

The control unit 140 controls units of the image forming apparatus 110, and is realized by for example a central processing unit (CPU), a read only memory (ROM), and a random access memory (RAM). The control unit 140 calculates a total power value (digital value) of the image forming system 100 based on the voltage value output by the voltage detecting unit 120, the current value output by the current detecting unit 130, the voltage value output by the voltage detecting unit 160, and the current value output by the current detecting unit 170. The control unit 140 causes the operation panel 145 to notify the calculated total power value of the image forming system 100.

The control unit 140 reads the voltage value output by the voltage detecting unit 120, the current value output by the current detecting unit 130, the voltage value output by the voltage detecting unit 160, and the current value output by the current detecting unit 170 with an extremely short period (for example, 1 milliseconds), and calculates the total power value of the image forming system 100 by using the voltage values and the current values read as above. Therefore, the control unit 140 calculates the total power of the image forming system 100 in real time and causes the operation panel 145 to notify the total power in real time. In the first embodiment, the control unit 140 continues to calculate the total power value of the image forming system 100 even during an idling time of the image forming system 100.

The operation panel 145 is an operation display unit for inputting various operations on the image forming apparatus 110 (the image forming system 100) or for displaying various screens. The operation panel 145 receives an instruction from the control unit 140 and displays a total power value of the image forming system 100 on a screen.

Figure 5:
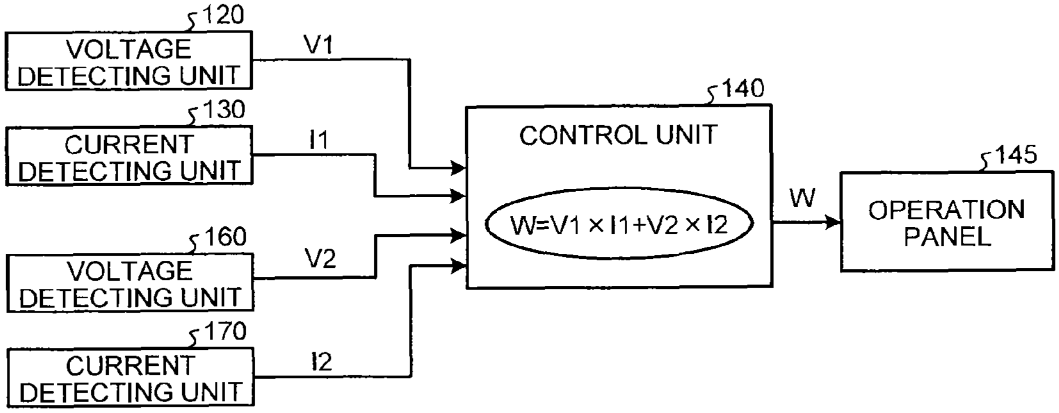
FIG. 5 is a diagram illustrating an example of a data flow in the image forming system according to the first embodiment.

FIG. 5 is a diagram illustrating an example of a data flow in the image forming system 100 according to the first embodiment. As illustrated in FIG. 5, the voltage detecting unit 120 outputs a detected voltage value V1 to the control unit 140, the current detecting unit 130 outputs a detected current value I1 to the control unit 140, the voltage detecting unit 160 outputs a detected voltage value V2 to the control unit 140, and the current detecting unit 170 outputs a detected current value I2 to the control unit 140. The control unit 140 reads the voltage value V1, the current value I1, the voltage value V2, and the current value I2, and calculates the total power value of the image forming system 100. Specifically, the control unit 140 calculates a total power value W of the image forming system 100 by Equation (1) below.

$$W = V1 \times I1 + V2 \times I2 \quad (1)$$

Specifically, the control unit 140 calculates the total power value of the image forming apparatus 110 and the total power value of the peripheral device 150, and adds the total power value of the image forming apparatus 110 and the total power value of the peripheral device 150 to calculate the total power value W of the image forming system 100. The control unit 140 causes the operation panel 145 to notify the calculated total power value W.

Figure 6:
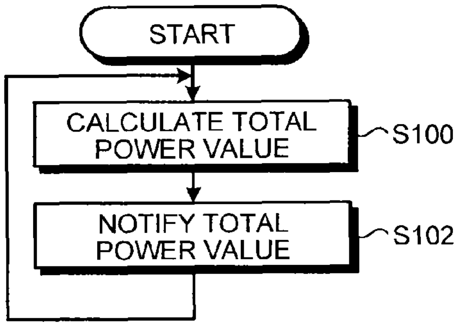
FIG. 6 is a flowchart illustrating an example of a total power value calculation process performed by the image forming system according to the first embodiment.

FIG. 6 is a flowchart illustrating an example of a total power value calculation process performed by the image forming system 100 according to the first embodiment. The process illustrated in the flowchart in FIG. 6 is continuously repeated with an extremely short period of for example 1 millisecond.

The control unit 140 calculates the total power value of the image forming system 100 by using the voltage value output by the voltage detecting unit 120, the current value output by the current detecting unit 130, the voltage value output by the voltage detecting unit 160, and the current value output by the current detecting unit 170 (Step S100).

The control unit 140 causes the operation panel 145 to notify the calculated total power value of the image forming system 100 (Step S102).

As described above, according to the first embodiment, not only the total power of the image forming apparatus but also the total power of the peripheral device is actually measured. Therefore, it is possible to calculate the total power of the image forming system with accuracy. Furthermore, according to the first embodiment, the total power of the image forming system is calculated with an extremely short period. Therefore, it is possible to calculate the total power of the image forming system in real time. The calculated total power of the image forming system can be used for, for example, calculating the amount of carbon dioxide emission or stimulating user's motivation for energy saving.

Second Embodiment

In a second embodiment, an example will be explained in which a peripheral device calculates the total power value thereof and outputs the calculated total power value to an image forming apparatus. In the following, differences from the first embodiment will be mainly explained. Components having the same functions as those of the first embodiment are denoted by the same name or the same reference symbols as the first embodiment; and explanation thereof will be omitted.

Figure 7:
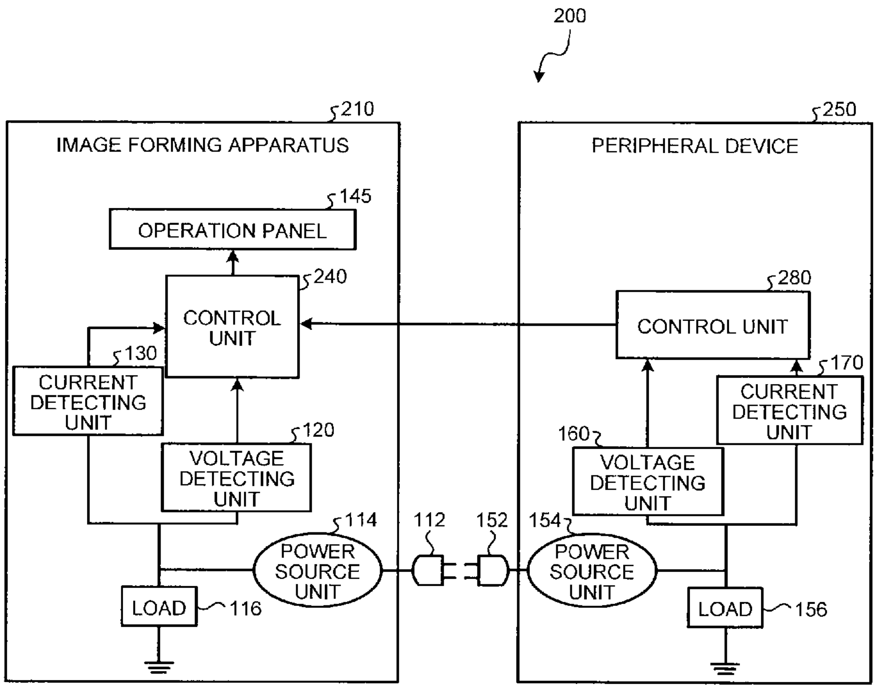
FIG. 7 is a block diagram of an example configuration of an image forming system according to a second embodiment.

FIG. 7 is a block diagram of an example configuration of an image forming system 200 according to the second embodiment. As illustrated in FIG. 7, the second embodiment differs from the first embodiment in that a peripheral device 250 includes a control unit 280 and a control unit 240 of an image forming apparatus 210 performs a process with different process contents.

The control unit 280 controls units of the peripheral device 250, and is realized by for example a CPU, a ROM, and a RAM. The control unit 280 calculates a total power value (digital value) of the peripheral device 250 based on the voltage value output by the voltage detecting unit 160 and the current value output by the current detecting unit 170. The control unit 140 outputs the total power value of the peripheral device 250 to the image forming apparatus 210 (the control unit 240).

The control unit 280 reads the voltage value output by the voltage detecting unit 160 and the current value output by the current detecting unit 170 with an extremely short period (for example, 1 millisecond); and calculates the total power value of the peripheral device 250 by using the voltage value and the current value read as above. Therefore, the control unit 280 calculates the total power value of the peripheral device 250 in real time and outputs the total power value to the image forming apparatus 210 in real time.

The control unit 240 calculates the total power value (digital value) of the image forming apparatus 210 based on the voltage value output by the voltage detecting unit 120 and the current value output by the current detecting unit 130, and adds the total power value of the image forming apparatus 210 and the total power value of the peripheral device 250 to obtain the total power value of the image forming system 200.

Figure 8:
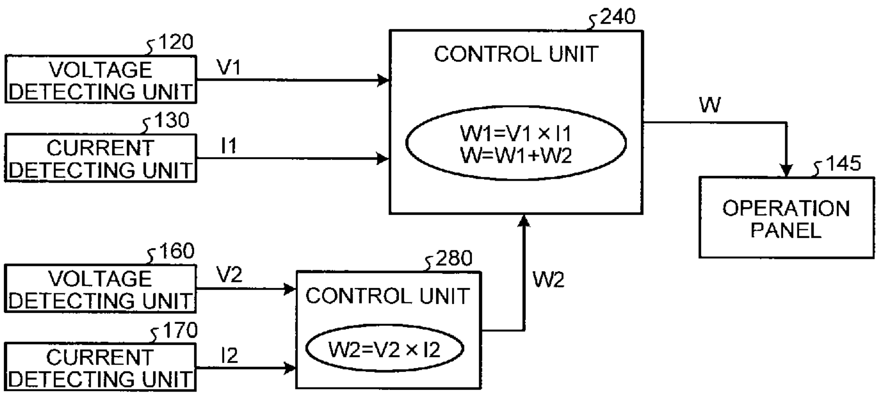
FIG. 8 is a diagram illustrating an example of a data flow in the image forming system according to the second embodiment.

FIG. 8 is a diagram illustrating an example of a data flow in the image forming system 200 according to the second embodiment. As illustrated in FIG. 8, the voltage detecting unit 120 outputs the detected voltage value V1 to the control unit 240, and the current detecting unit 130 outputs the detected current value I1 to the control unit 240. The voltage detecting unit 160 outputs the detected voltage value V2 to the control unit 280, and the current detecting unit 170 outputs the detected current value I2 to the control unit 280. The control unit 280 reads the voltage value V2 and the current value I2 and calculates a total power value W2 (=V2×I2) of the peripheral device 250, and outputs the calculated total power value W2 of the peripheral device 250 to the image forming apparatus 210. The control unit 240 reads the voltage value V1, the current value I1, and the total power value W2; calculates a total power value W1 (=V1×I1) of the image forming apparatus 210 based on the voltage value V1 and the current value I1; and adds the total power value W1 of the image forming apparatus 210 and the total power value W2 of the peripheral device 250 to obtain the total power value W (=W1+W2) of the image forming system 200. The control unit 240 causes the operation panel 145 to notify the total power value W.

Figure 9:
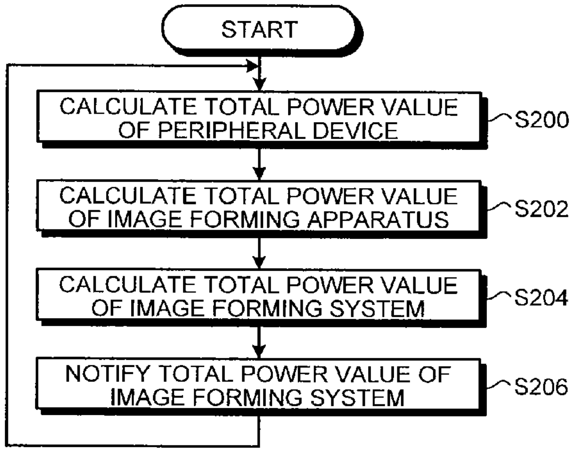
FIG. 9 is a flowchart illustrating an example of a total power value calculation process performed by the image forming system according to the second embodiment.

FIG. 9 is a flowchart illustrating an example of a total power value calculation process performed by the image forming system 200 according to the second embodiment. The process illustrated in the flowchart in FIG. 9 is continuously repeated with an extremely short period of for example 1 millisecond.

The control unit 280 calculates the total power value of the peripheral device 250 by using the voltage value output by the voltage detecting unit 160 and the current value output by the current detecting unit 170 (Step S200).

The control unit 240 calculates the total power value of the image forming apparatus 210 by using the voltage value output by the voltage detecting unit 120 and the current value output by the current detecting unit 130 (Step S202).

The control unit 240 adds the total power value of the peripheral device 250 and the total power value of the image forming apparatus 210 to thereby obtain the total power value of the image forming system 200 (Step S204).

The control unit 240 causes the operation panel 145 to notify the calculated total power value of the image forming system 200 (Step S206).

As described above, according to the second embodiment, the peripheral device outputs not an analog value but a digital value to the image forming apparatus. Therefore, it becomes possible to calculate the total power of the image forming system with accuracy.

Third Embodiment

In a third embodiment, an example is explained in which the total power value of a job performed by an image forming system is calculated. In the following, differences from the first embodiment will be mainly explained. Components having the same functions as those of the first embodiment are denoted by the same name or the same reference symbols as the first embodiment, and explanation thereof will be omitted.

Figure 10:
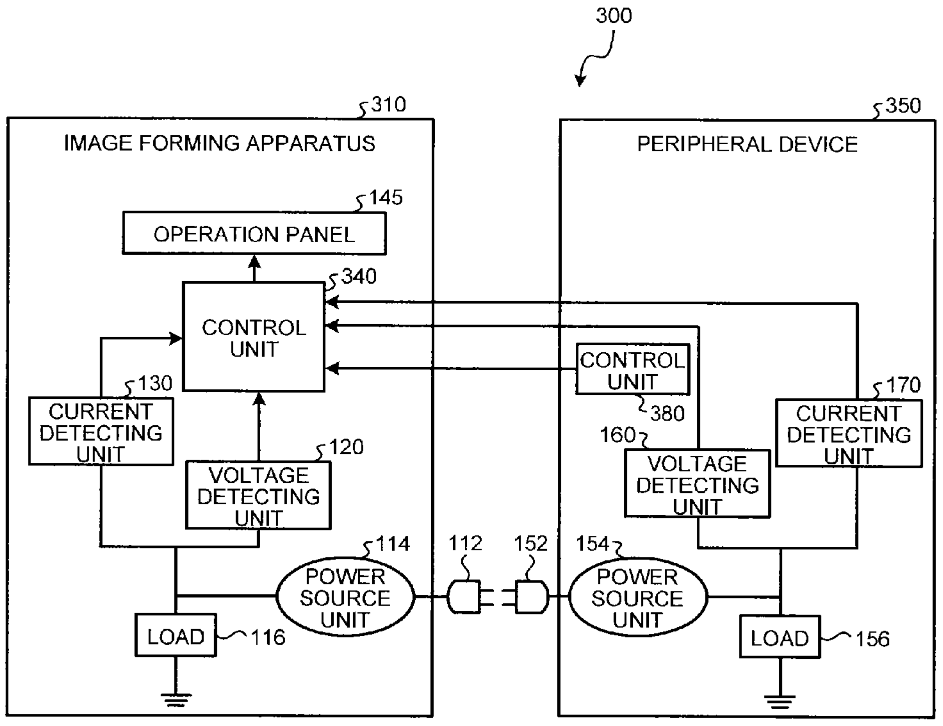
FIG. 10 is a block diagram of an example configuration of an image forming system according to a third embodiment.

FIG. 10 is a block diagram of an example configuration of an image forming system 300 according to the third embodiment. As illustrated in FIG. 10, the third embodiment differs from the first embodiment in that a peripheral device 350 includes a control unit 380 and a control unit 340 of an image forming apparatus 310 performs a process with different process contents.

The control unit 340 calculates a total power value needed to perform a job by the image forming system 300, on the basis of the voltage value output by the voltage detecting unit 120, the current value output by the current detecting unit 130, the voltage value output by the voltage detecting unit 160, and the current value output by the current detecting unit 170 during a period from start to end of the job. The control unit 340 executes the job for causing the load 116 to perform image formation and generate a printed matter and for discharging the printed matter to the peripheral device 350. The control unit 340 determines that the job is completed when receiving a notice indicating that all of the printed matters generated by the job are completely discharged from the peripheral device 350.

The control unit 380 controls units of the peripheral device 350, and is realized by for example a CPU, a ROM, and a RAM. When the control unit 340 executes a job, the control unit 380 causes the load 156 to perform post processing on a printed matter generated by the image forming apparatus 310 and discharges the printed matter to the outside. When all of the printed matters in the peripheral device 350 are discharged, the control unit 380 sends a notice of completion of discharge to the image forming apparatus 310. The discharge of the printed matters from the inside of the peripheral device 350 is detected by the load 156.

Figure 11:
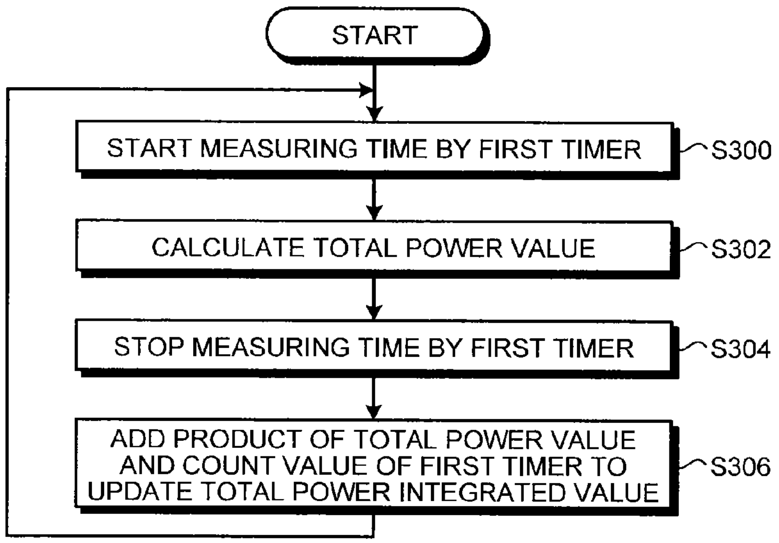
FIG. 11 is a flowchart illustrating an example of a total power value calculation process performed by the image forming system according to the third embodiment.

FIG. 11 is a flowchart illustrating an example of a total power value calculation process performed by the image forming system 300 according to the third embodiment. The process illustrated in the flowchart in FIG. 11 is continuously repeated with an extremely short period of, for example, 1 millisecond.

The control unit 340 causes a first timer to start measuring (counting) time before calculation of the total power value of the image forming system 300 (Step S300).

The control unit 340 calculates the total power value of the image forming system 300 by using the voltage value output by the voltage detecting unit 120, the current value output by the current detecting unit 130, the voltage value output by the voltage detecting unit 160, and the current value output by the current detecting unit 170 (Step S302).

The control unit 340 causes the first timer to stop measuring the time when the calculation of the total power value of the image forming system 300 is completed (Step S304).

The control unit 340 multiplies the total power value of the image forming system 300 by a count value obtained by the first timer and adds the obtained product to a total power integrated value stored in the RAM or the like to thereby update the total power integrated value (Step S306). That is, the total power integrated value indicates the accumulated total of the total power values of the image forming system 300.

Figure 12:
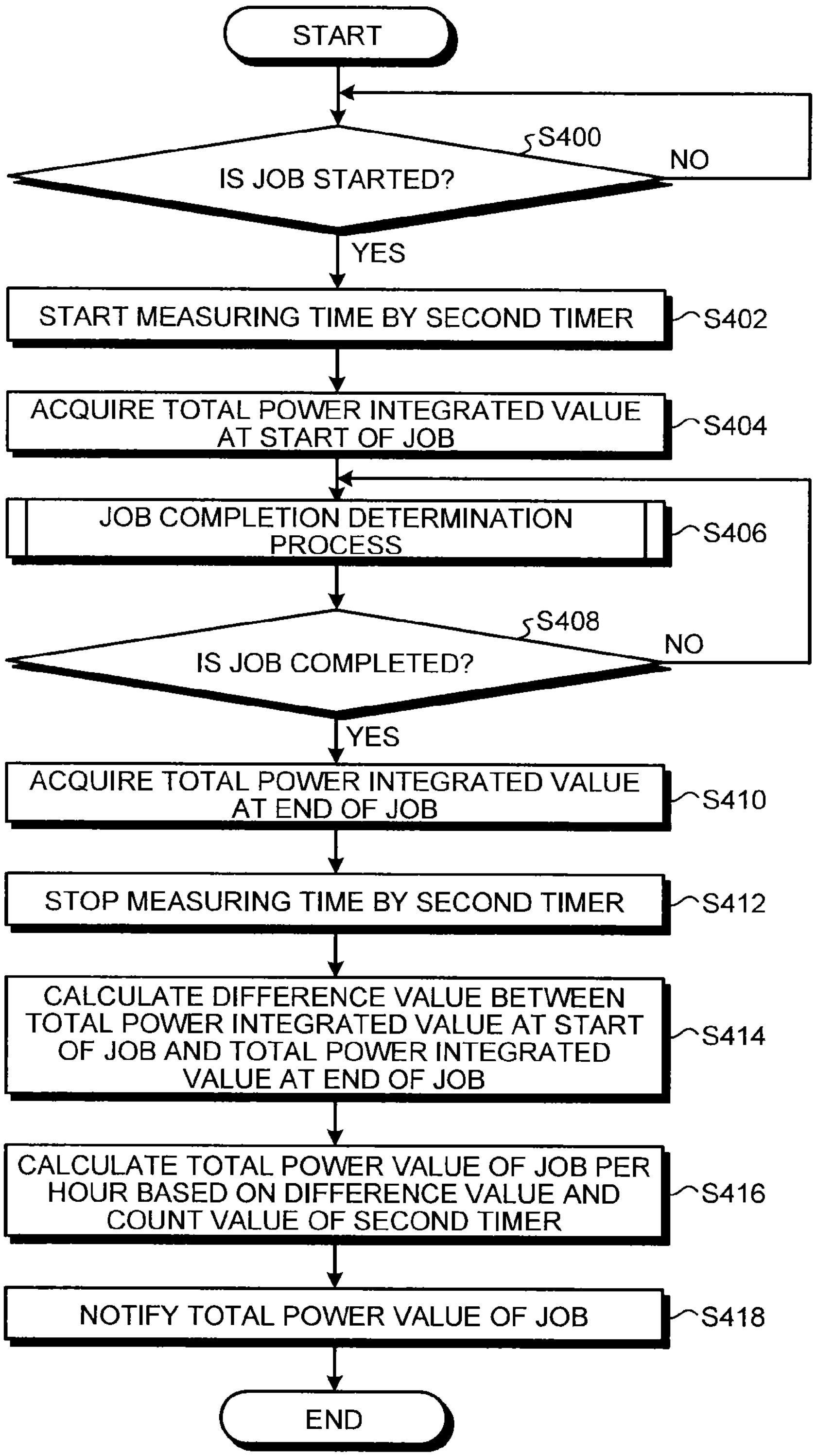
FIG. 12 is a flowchart illustrating an example of a process for calculating total power needed to perform job processing by the image forming system according to the third embodiment.

FIG. 12 is a flowchart illustrating an example of a process for calculating the total power needed to perform job processing by the image forming system 300 according to the third embodiment. The process illustrated in the flowchart in FIG. 12 is performed with a longer period (for example 60 milliseconds) than the period for the process illustrated in the flowchart in FIG. 11.

The control unit 340 waits for a job to be started (NO at Step S400). When the job is started (YES at Step S400), the control unit 340 causes a second timer to start measuring (counting) time (Step S402).

The control unit 340 acquires the total power integrated value at the start of the job from the RAM (Step S404).

The control unit 340 repeats a job completion determination process until it is determined that the job is completed (Step S406 and NO at Step S408). When it is determined that the job is completed (YES at Step S408), the control unit 340 acquires the total power integrated value at the end of the job from the RAM (Step S410). The job completion determination process will be described in detail later.

When the job is completed, the control unit 340 causes the second timer to stop measuring time (Step S412).

The control unit 340 calculates a difference value between the total power integrated value at the start of the job and the total power integrated value at the end of the job (Step S414).

The control unit 340 calculates the total power value of the job per hour based on the difference value and a count value obtained by the second timer (Step S416).

The control unit 340 causes the operation panel 145 to notify the calculated total power value of the job (Step S418).

Figure 13:
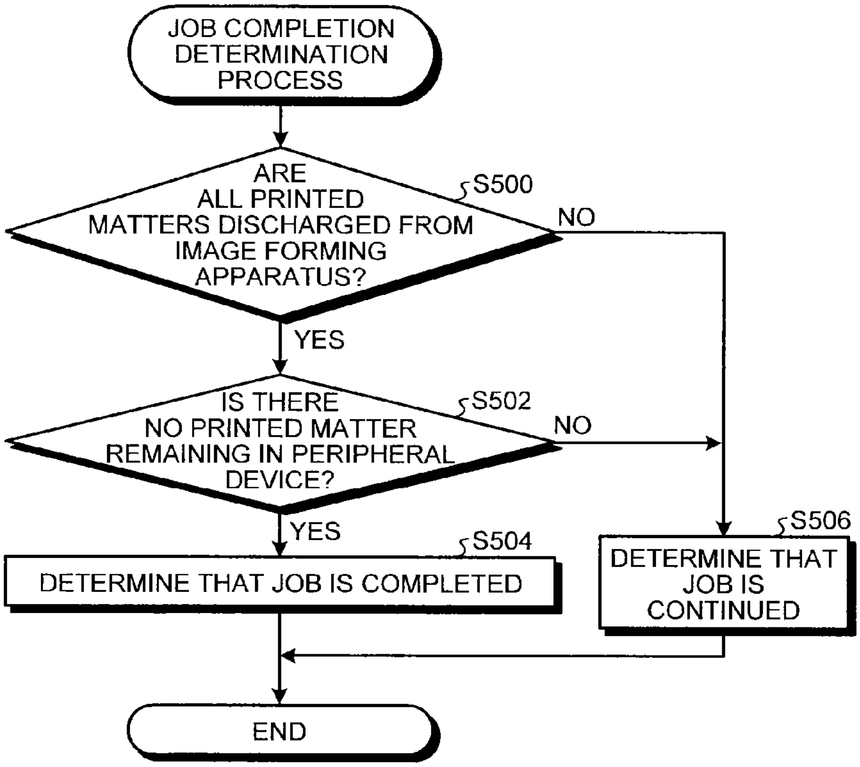
FIG. 13 is a flowchart illustrating an example of a job completion determination process performed by the image forming system according to the third embodiment.

FIG. 13 is a flowchart illustrating an example of the job completion determination process performed by the image forming system 300 according to the third embodiment.

The control unit 340 determines whether all of printed matters generated through the job are discharged from the image forming apparatus 310 (Step S500).

When all of the printed matters are discharged from the image forming apparatus 310 (YES at Step S500), the control unit 340 checks whether a notice, which indicates that all of the printed matters generated by the job are completely discharged, is received from the peripheral device 350, thereby confirming whether a printed matter remains in the peripheral device 350 (Step S502).

When no printed matter remains in the peripheral device 350 (YES at Step S502), the control unit 340 determines that the job is completed (Step S504). When all of the printed matters are not discharged from the image forming apparatus 310 (NO at Step S500), or when a printed matter remains in the peripheral device 350 (NO at Step S502), the control unit 340 determines that the job is continued (Step S506).

As described above, according to the third embodiment, it is possible to accurately calculate the total power needed to perform a job by the image forming system.

MODIFICATIONS

The present embodiments may be modified in various forms.

First Modification

In the first embodiment described above, an example is explained in which the secondary voltage and the secondary current of the power source unit 114 of the image forming apparatus 110 are detected. However, it may be configured to detect a primary voltage and a primary current (on the AC side) of the power source unit 114.

Figure 14:
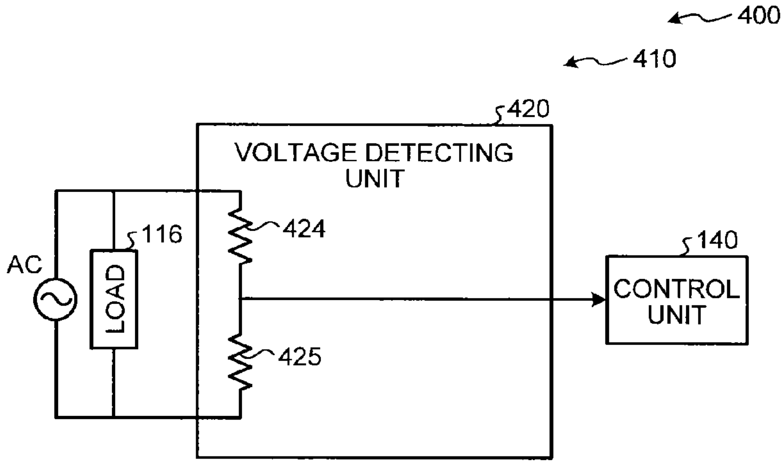
FIG. 14 is a circuit diagram of an example configuration of a voltage detecting unit when an image forming apparatus according to a first modification detects a voltage by a system using a voltage divider resistance.

FIG. 14 is a circuit diagram of an example configuration of a voltage detecting unit 420 in a case where an image forming apparatus 410 of an image forming system 400 according to a first modification detects a voltage by a system using a voltage divider resistance. As illustrated in FIG. 14, the voltage detecting unit 420 includes voltage divider resistances 424 and 425. The voltage detecting unit 420 reduces the voltage of the power that is supplied by an external power source, such as an AC power source, down to within the rated input voltage of the control unit 140 by the voltage divider resistances 424 and 425. Consequently, the voltage detecting unit 420 outputs a primary voltage value of the power source unit 114 (not illustrated).

Figure 15:
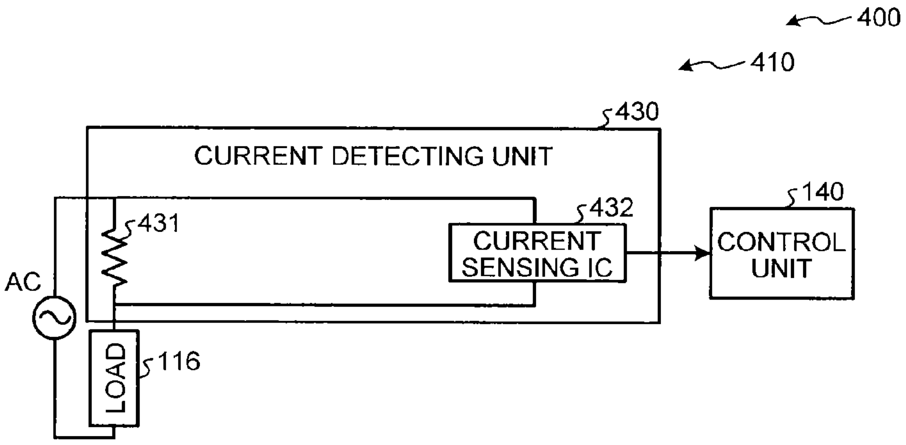
FIG. 15 is a circuit diagram of an example configuration of a current detecting unit when the image forming apparatus of an image forming system according to the first modification detects an electric current by a system using a current sensing IC.

FIG. 15 is a circuit diagram of an example configuration of a current detecting unit 430 when the image forming apparatus 410 of the image forming system 400 according to the first modification detects an electric current by a system using a current sensing IC. As illustrated in FIG. 15, when an electric current is detected by the system using a current sensing IC, the current detecting unit 430 includes a micro resistance 431 and a current sensing IC 432. The current detecting unit 430 reduces the voltage of the power supplied by an external power source, such as an AC power source, by the micro resistance 431 and detects a current value by the current sensing IC 432. Consequently, the current detecting unit 430 outputs a primary current value of the power source unit 114 (not illustrated).

In the second or the third embodiment, it may be configured to detect the primary voltage and the primary current of the power source unit 114. Furthermore, it may be configured to cause the peripheral devices of the first to the third embodiments to detect the primary voltage and the primary current of the power source unit 154 similarly to the above, although detailed explanation will not be described herein.

Second Modification

In the above embodiments, an example is explained in which one peripheral device is provided. However, it may be configured to provide a plurality of peripheral devices.

Third Modification

It may be configured to combine for example the second and the third embodiments.

Fourth Modification

For example, in the above embodiments, the image forming system may include a server device and causes the server device to calculate the total power value (digital value) of the image forming system.

Figure 16:
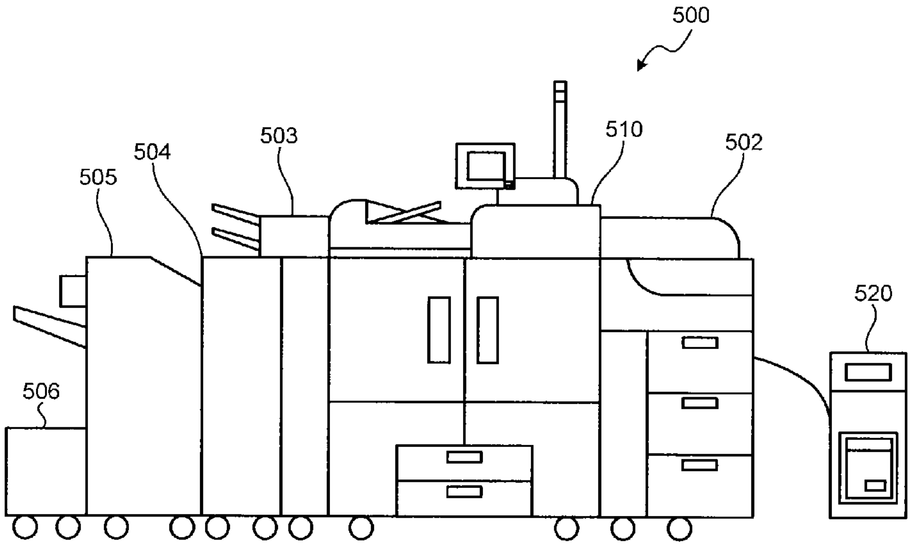
FIG. 16 is an external view illustrating an example of an image forming system according to a fourth modification.

FIG. 16 is an external view illustrating an example of an image forming system 500 according to a fourth modification. The image forming system 500 is a production printing machine and includes a server device 520. The image forming system 500 is formed by combining an image forming apparatus 510 with peripheral devices, such as a high-capacity sheet feed unit 502 for feeding sheets, an inserter 503 used for forming a cover or the like, a folding unit 504 for folding sheets, a finisher 505 for performing stapling or punching, and a cutter 506 for cutting sheets, according to the purpose of use. The peripheral devices of the above embodiments correspond to the high-capacity sheet feed unit 502, the inserter 503, and the folding unit 504; however, the embodiment is not limited to this example.

Figure 17:
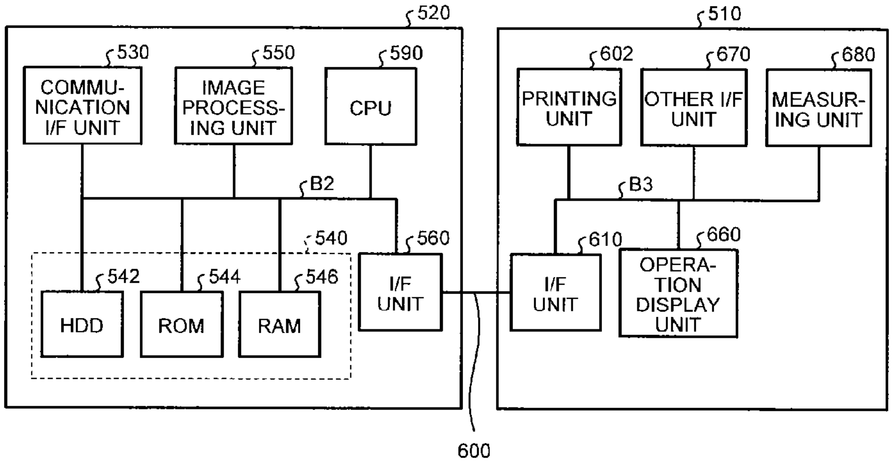
FIG. 17 is a diagram of an example hardware configuration of a server device according to the fourth modification.

FIG. 17 is a diagram of an example hardware configuration of the server device 520 according to the fourth modification. As illustrated in FIG. 17, the server device 520 includes a communication I/F unit 530, a storage unit 540 (a hard disk drive (HDD) 542, a ROM 544, and a RAM 546), an image processing unit 550, a CPU 590, and an I/F unit 560, which are connected to one another via a bus B2. In the example in FIG. 17, the server device 520 is connected to the image forming apparatus 510 via a leased line 600.

As illustrated in FIG. 17, the image forming apparatus 510 includes an I/F unit 610, a printing unit 602, an operation display unit 660, an other I/F unit 670, and a measuring unit 680, such as a current detecting unit or a voltage detecting unit, which are connected to one another via a bus B3. The I/F unit 610 is a means for connecting the image forming apparatus 510 to the server device 520. The leased line 600 is connected to the I/F unit 610. The image forming apparatus 510 executes a print job under the control of the CPU 590 of the server device 520.

The CPU 590 included in the server device 520 executes a process performed by the control units of the image forming apparatuses of the above embodiments.

Hardware Configuration

Figure 18:
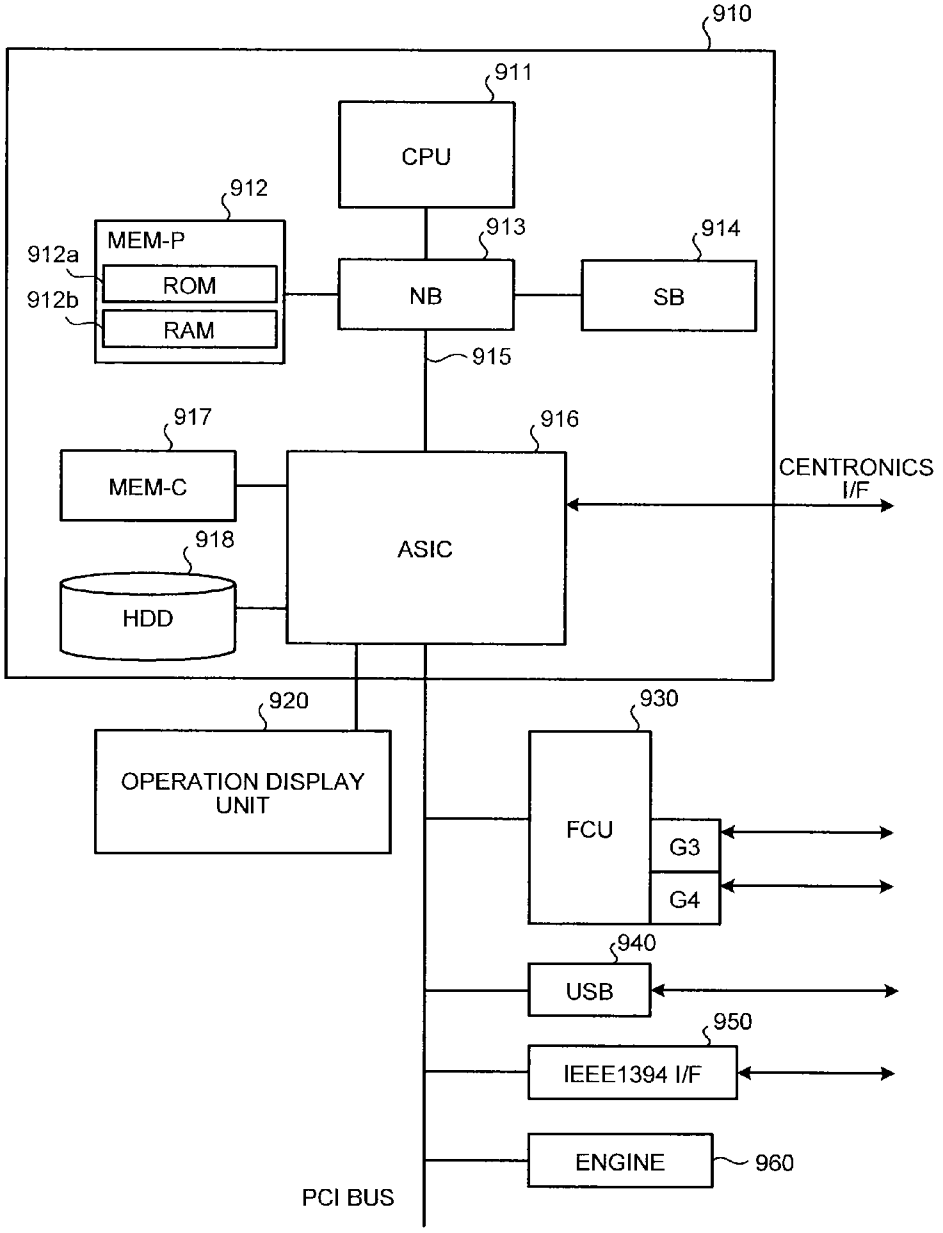
FIG. 18 is a block diagram of an example hardware configuration of an image forming apparatus according to the embodiments and the modifications.

FIG. 18 is a block diagram illustrating an example hardware configuration of the image forming apparatus of the embodiments and the modifications described above. As illustrated in FIG. 18, the image forming apparatus of each of the embodiments and the modifications includes a controller 910 and an engine unit (Engine) 960, which are connected to each other via a peripheral component interface (PCI) bus. The controller 910 is a controller that controls the entire image forming apparatus, picture processing, communications, and input operations through an operating unit, such as an operation display unit 920. The engine unit 960 is a printer engine etc. that is connectable to the PCI bus. Examples of the engine unit 960 include a monochrome plotter, a one-drum color plotter, a four-drum color plotter, a scanner, and a facsimile unit. The engine unit 960 includes an image processing section for performing error diffusion, gamma correction, or the like, in addition to what is called an engine section, such as the plotter.

The controller 910 includes a CPU 911, a north bridge (NB) 913, a system memory (MEM-P) 912, a south bridge (SB) 914, a local memory (MEM-C) 917, an application specific integrated circuit (ASIC) 916, and a HDD 918. The NB 913 and the ASIC 916 are connected to an accelerated graphics port (AGP) bus 915. The MEM-P 912 includes a ROM 912*a* and a RAM 912*b*.

The CPU 911 controls the entire image forming apparatus. The CPU 911 includes a chip set formed of the NB 913, the MEM-P 912, and the SB 914. The CPU 911 is connected to other apparatuses via the chip set.

The NB 913 is a bridge for connecting the CPU 911, the MEM-P 912, the SB 914, and the AGP bus 915 to one another. The NB 913 includes a memory controller for controlling read and write with respect to the MEM-P 912, and also includes a PCI master and an AGP target.

The MEM-P 912 is a system memory used as a memory for storing computer programs and data, a memory for loading computer programs and data, and a memory for use in picture processing performed by a printer. The MEM-P 912 includes the ROM 912*a* and the RAM 912*b*. The ROM 912*a* is a read-only memory for storing computer programs and data. The RAM 912*b* is a writable and readable memory used for loading computer programs and data or used for picture processing performed by a printer.

The SB 914 is a bridge for connecting the NB 913, PCI devices, and peripheral devices to one another. The SB 914 is connected to the NB 913 via the PCI bus. A network interface (I/F) or the like is also connected to the PCI bus.

The ASIC 916 is an IC used for image processing including a hardware element for image processing. The ASIC 916 has a function as a bridge to connect the AGP bus 915, the PCI bus, the HDD 918, and the MEM-C 917 to one another. The ASIC 916 includes a PCI target and an AGP master; an arbiter (ARB) that is the central core of the ASIC 916; a memory controller that controls the MEM-C 917; a plurality of direct memory access controllers (DMACs) that rotates image data by using hardware logic; and a PCI unit that performs data transfer with the engine unit 960 via the PCI bus. A facsimile control unit (FCU) 930, a universal serial bus (USB) 940, and the institute of electrical and electronics engineers 1394 (IEEE 1394) interface 950 are connected to the ASIC 916 via the PCI bus. The operation display unit 920 is directly connected to the ASIC 916.

The MEM-C 917 is a local memory for use as a copy image buffer and a code buffer. The HDD 918 is a storage device for storing image data, computer programs, font data, and forms.

The AGP bus 915 is a bus interface for a graphics accelerator card introduced to speed up graphics operations. The AGP bus 915 allows direct access to the MEM-P 912 with a high throughput, thereby speeding up operations related to the graphics accelerator card.

According to one embodiment, it is possible to accurately calculate total power of the image forming system.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An image forming system comprising:

an image forming apparatus that includes a first power source that converts at least a voltage of power supplied by an external power source and that provides power to a load of the image forming apparatus, a first voltage detector that detects one of a primary voltage and a secondary voltage of the first power source and outputs a value of the detected voltage as a first voltage value;

a first current detector that detects one of a primary current and a secondary current of the first power source, and outputs a value of the detected current as a first current value; and a peripheral device connected to the image forming apparatus, the peripheral device including a second power source that is separate from the first power source and that converts at least a voltage of power supplied by the external power source and that provides power to a load of the peripheral device;

a second voltage detector that detects one of a primary voltage and a secondary voltage of the second power source and outputs a value of the detected voltage as a second voltage value; and a second current detector that detects one of a primary current and a secondary current of the second power source and outputs a value of the detected current as a second current value, wherein the image forming apparatus further includes a first controller that calculates electric power consumed by the peripheral device based on the second voltage value, and the second current value and that calculates a total power value of the image forming system based on the first voltage value, the first current value, the second voltage value, and the second current value.

2. The image forming system according to claim 1, wherein the peripheral device further includes a second controller that calculates a total power value of the peripheral device by using the second voltage value and the second current value and outputs the total power value, and the first controller calculates a total power value of the image forming apparatus by using the first voltage value and the first current value, and adds the total power value of the image forming apparatus and the total power value of the peripheral device to thereby obtain the total power value of the image forming system.

3. The image forming system according to claim 1, wherein the first controller calculates a total power value needed to perform a job by the image forming system on the basis of the first voltage value, the first current value, the second voltage value, and the second current value that are obtained during a period from start to end of the job.

4. The image forming system according to claim 3, wherein when receiving, from the peripheral device, a notice indicating that all of printed matters generated through the job are completely discharged, the first controller determines that the job is completed.

5. The image forming system according to claim 1, wherein the first controller causes a notifying unit to notify the calculated total power value.

6. A power calculation method for an image forming system that comprises an image forming apparatus and a peripheral device, the power calculation method comprising:

first detecting that includes detecting, by a first voltage detector of the image forming apparatus, one of a primary voltage and a secondary voltage of a first power source that converts at least a voltage of power supplied by an external power source and so as to output a value of the detected voltage as a first voltage value;

second detecting that includes detecting, by a first current detector of the image forming apparatus, one of a primary current and a secondary current of the first power source so as to output a value of the detected current as a first current value, the first power source providing power to a load of the image forming apparatus;

third detecting that includes detecting, by a second voltage detector of the peripheral device, one of a primary voltage and a secondary voltage of a second power source that converts at least a voltage of power supplied by the external power source so as to output a value of the detected voltage as a second voltage value, the second power source being separate from the first power source and providing power to a load of the peripheral device;

fourth detecting that includes detecting, by a second current detector of the peripheral device, one of a primary current and a secondary current of the second power source so as to output a value of the detected current as a second current value;

calculating, by a first controller of the image forming apparatus, an electric power consumed by the peripheral device based on the second voltage value, and the second current value; and calculating, by the first controller, a total power value of the image forming system based on the first voltage value, the first current value, the second voltage value, and the second current value.

7. A power calculating apparatus that calculates total power of an image forming system comprising at least an image forming apparatus and a peripheral device, wherein the power calculating apparatus calculates the total power of the image forming system based on:

a first voltage value being a value of one of a primary voltage and a secondary voltage of a first power source that converts at least a voltage of power supplied from an external power source to the image forming apparatus and that provides power to a load of the image forming apparatus;

a first current value being a value of one of a primary current and a secondary current of the first power source;

a second voltage value being a value of one of a primary voltage and a secondary voltage of a second power source that converts at least a voltage of power supplied from the external power source to the peripheral device and that provides power to a load of the peripheral device, the second power source being separate from the first power source; and a second current value being a value of one of a primary current and a secondary current of the second power source, wherein the power calculating apparatus calculates an electric power consumed by the peripheral device based on the second voltage value and the second current value and calculates a total power value of the image forming system based on the first voltage value, the first current value, the second voltage value, and the second current value.

* * * * *